US006597241B1

(12) United States Patent
Moeneclaey et al.

(10) Patent No.: US 6,597,241 B1
(45) Date of Patent: Jul. 22, 2003

(54) HIGH PERFORMANCE AUDIO TRANSMISSION CHANNEL

(75) Inventors: Nicolas Moeneclaey, Asnieres sur Seine (FR); Pierre Genest, Rouffiac Tolosan (FR); Frank Op 'T Eynde, Wilsele (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/857,235

(22) PCT Filed: Oct. 4, 2000

(86) PCT No.: PCT/FR00/02762

§ 371 (c)(1), (2), (4) Date: Sep. 13, 2001

(87) PCT Pub. No.: WO01/26416

PCT Pub. Date: Apr. 12, 2001

(30) Foreign Application Priority Data

Oct. 4, 1999 (FR) .......................................... 99 12350

(51) Int. Cl.⁷ ................................................ H03F 3/38
(52) U.S. Cl. ...................... 330/10; 330/207 A; 381/120
(58) Field of Search .............................. 330/10, 207 A, 330/251; 381/120

(56) References Cited

U.S. PATENT DOCUMENTS 4,554,512 A * 11/1985 Aiello ......................... 330/10
5,398,003 A 3/1995 Heyl et al.
5,442,317 A 8/1995 Stengel
5,672,998 A * 9/1997 Wittlinger .................... 330/10
5,898,340 A 4/1999 Chatterjee et al.
6,016,075 A * 1/2000 Hamo ......................... 330/10
6,373,334 B1 * 4/2002 Melanson .................... 330/10

FOREIGN PATENT DOCUMENTS

FR 2 765 419 12/1998

* cited by examiner

*Primary Examiner*—Henry Choe
(74) *Attorney, Agent, or Firm*—Sughrue Mion, PLLC

(57) ABSTRACT

An audio receiver system including:

a modulator (1) for modulating a first digital audio signal with a first modulation rate and a second digital audio signal including a plurality of 1-bit words over a predetermined period at a second modulation rate higher than the first modulation rate, and an output device (11) including a loudspeaker (10) and a transmitter for transmitting the second signal in analog form to the loudspeaker (10), characterized in that it further includes a control device (2) connected to the modulator (1) and receiving the signal from it and to the output device (11), the control device is adapted to control the output device (11) from a portion-of said predetermined period, and the length of said portion is determined as a function of the required volume.

8 Claims, 2 Drawing Sheets

HIGH PERFORMANCE AUDIO TRANSMISSION CHANNEL

BACKGROUND OF THE INVENTION

The present invention relates to audio receiver systems, in particular in portable systems of low power consumption.

There are various systems for converting a digital signal into an analog power signal for reproducing sounds via a loudspeaker.

Patent application FR-A-2765419 describes a device for generating analog signals using analog-to-digital converters. It describes the use of a Sigma-Delta modulator for transmitting digital signals and generating analog signals but there is no mention of a simple way to control the output volume.

The converter which converts digital signals into analog signals generally includes a volume control. The converter is followed by a low-pass filter that eliminates frequency components associated with the sampling process and then a power amplifier. The power amplifier consumes a great deal of power and reduces the efficiency of the overall circuit. The system is not satisfactory because, even though it provides volume control, it requires a large number of analog components such as a one-bit digital-to-analog converter, active filters and a power amplifier. These components are integrated on a dedicated chip.

It is known in the art to use a Sigma-Delta modulator followed by a device for converting digital signals into analog signals and devices for filtering the noise generated on transmission, together with a sound generator device to generate the sound transmitted by the digital audio channel. The Sigma-Delta modulator is generally followed by a class D output.

Because of the additional components, the second solution, although essentially digital, cannot provide output volume control without reducing the signal-to-noise ratio. It has the advantage of requiring only one discrete passive filter (based on RLC components) in addition to the digital part, but does not provide volume control.

The Sigma-Delta modulator is used to convert from an N-bit word to an M-bit word, where M is less than N. It eliminates truncation errors in the wanted signal band, which is the band in which the sinusoidal or other signal is synthesized. Spectral components associated with truncation outside the wanted signal band are then rejected. In the application in accordance with the invention, the length of the output words is 1 bit. Moreover, the modulator output bit rate is greater than the input bit rote and can be adjusted to obtain an integer multiplication factor.

SUMMARY OF THE INVENTION

The invention aims to improve on the efficiency of the audio reception channel of the second solution using a minimum number of power-dissipating linear components. The channel has to convert digital input data into analog signals to enable volume control by the user, without losses in terms of the signal-to-noise ratio, and drive a low-impedance loudspeaker.

The invention provides an audio receiver system including a modulator for modulating a first digital audio signal with a first modulation rate and a second digital audio signal including a plurality of 1-bit words over a predetermined period at a second modulation rate higher than the first modulation rate, and an output device including a loudspeaker and a transmitter for transmitting the second signal in analog form to the loudspeaker.

In one particular embodiment, the above means are switching transistors of a class D output.

The system further includes a control device connected to the modulator and receiving the signal from it and to the output device. The control device is adapted to control the output device from a portion of said predetermined period, and the length of said portion is determined as a function of the required volume.

The invention also provides an audio reception method including a step of modulating a first digital audio signal with a first modulation rate and a second digital audio signal including a plurality of one-bit words over a predetermined period with a second modulation rate higher than the first modulation rate, and a step of receiving said second signal in a loudspeaker.

The first digital audio signal is advantageously modulated in a modulator and includes a plurality of 1-bit words.

Before the reception step, the loudspeaker is controlled as a function of a portion of said predetermined period, the length of said portion being determined as a function of the required volume. In one variant, the length of said portion commands application of a power supply short-circuit.

The output signal of the Sigma-Delta modulator is a 1 bit data stream at a frequency higher than the Nyquist frequency. The quantizing noise at this output is mainly at higher frequencies. This signal drives the switching transistors of the class D output directly. The low-pass filter at the class D output is a second order RLC filter in which the resistance forms the loudspeaker.

The digital information transmitted in the signal controls the volume by modifying the length of the output data ("0" or "1") of the bit stream from the Sigma-Delta modulator.

The output signal of the Sigma-Delta modulator is at a frequency Fe. The pilot frequency of the next step is a frequency of N*Fe, where N is an integer which is used to divide the period Te which is the reciprocal of the frequency Fe (Te=1/Fe). Two divisions are used during a period Te. The first division corresponds to the time during which the load is connected to the power supply S or -S, depending on the value of the output signal (Sdout) of the Sigma-Delta modulator. The second division corresponds to the time during which the load is short-circuited to ground.

The value of the ratio of the durations of the two divisions adjusts the volume.

To prevent excessive power consumption, or destruction of the MOS transistors, a time of non-overlap (TN) guarantees that the some side NMOS and PMOS are not conducting at the same time.

Each period of the output signal of the Sigma-Delta modulator is divided in two: the first division corresponds to the time during which the loudspeaker is energized and the second division corresponds to the time during which it is passive. The value of the ratio between the two divisions is used to adjust the volume.

All mobile terminals including a digital audio receiver can use the system according to the invention.

BRIEF DESCRIPTION OF THE DRAWINGS

The invention avoids adding a linear device such as an operational amplifier or lumped capacitors. Also, the digital process is simplified, which reduces the cost of the function. The precision of volume control depends on the precision of the main clock.

DETAILED DESCRIPTION OF THE INVENTION

Figure 1:
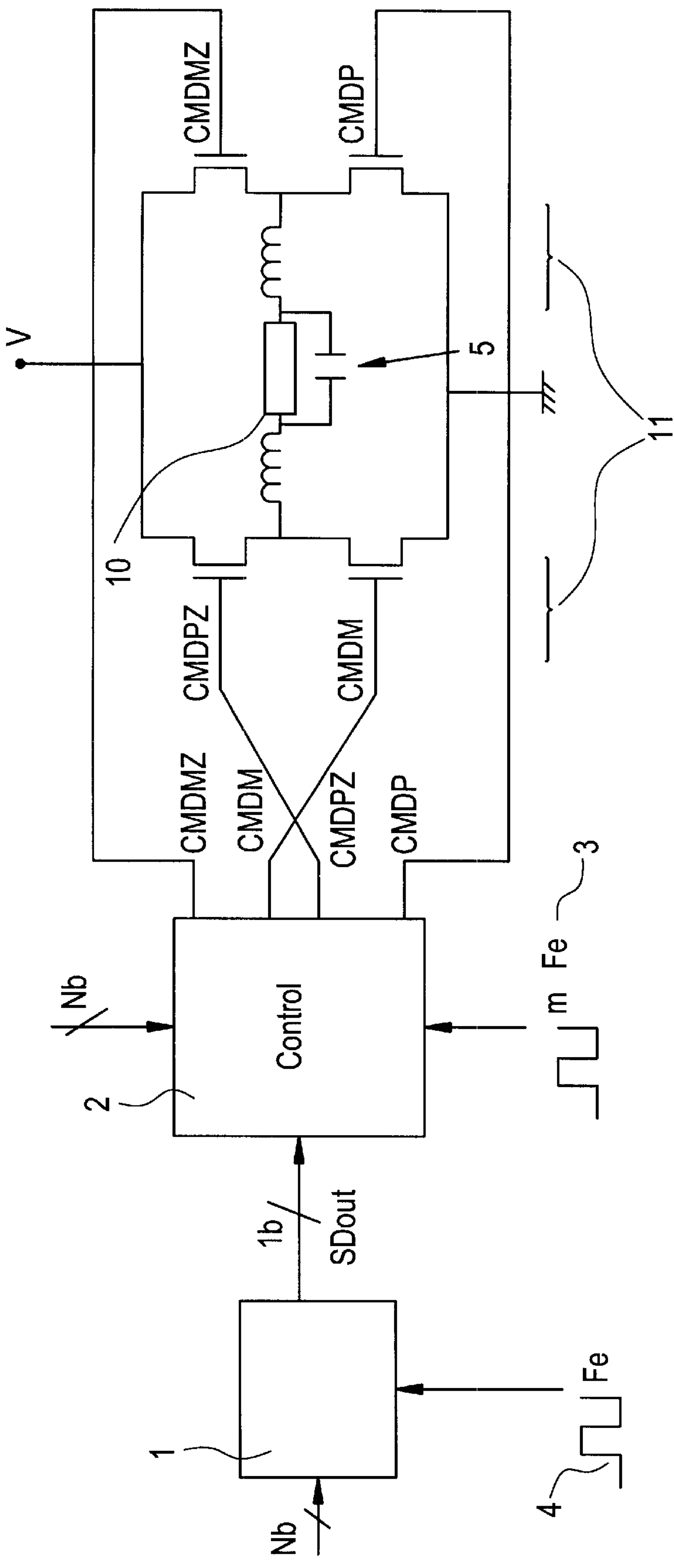
FIG. 1 is a general block diagram of a system according to the invention.

The control device 2 according to the invention follows the Sigma-Delta modulator 1 and receives its output signal, as can be seen in FIG. 1. The signal is then modulated in the control device 2 at a frequency Fc which is a multiple of the output frequency Fe of the Sigma-Delta modulator 1. In this example m=6 and Fe=2 MHz, so that Fc=12 MHz. The modulation is effected by means of a second clock 3. The second clock can be coupled to the clock of the Sigma-Delta modulator 4. The control device 2 therefore integrates data associated with volume into the divisions of the signal, defining time periods that contain the wanted signal.

The output device 11 includes a class D output bridge. The various terminals of the dipole (CMDP, CMDPZ, CMDM, CMDMZ) control the output signal as a function of the signal emitted by the control device 2. The bridge conventionally includes an RLC bridge 5. The RLC bridge provides a low-pass filter to improve the quality of the sound signal emitted by the resistor 10 which performs the role of loudspeaker. Of course, the low-pass filter can be implemented differently. The output device 11 is connected to a fixed supply voltage V and to ground.

The system according to the invention is intended for static volume control: it is well known that a user adjusts the volume of their device once or twice during use. The invention also exploits the fact that at high frequencies the user does not hear short-term interruptions in sound output.

Figure 2:
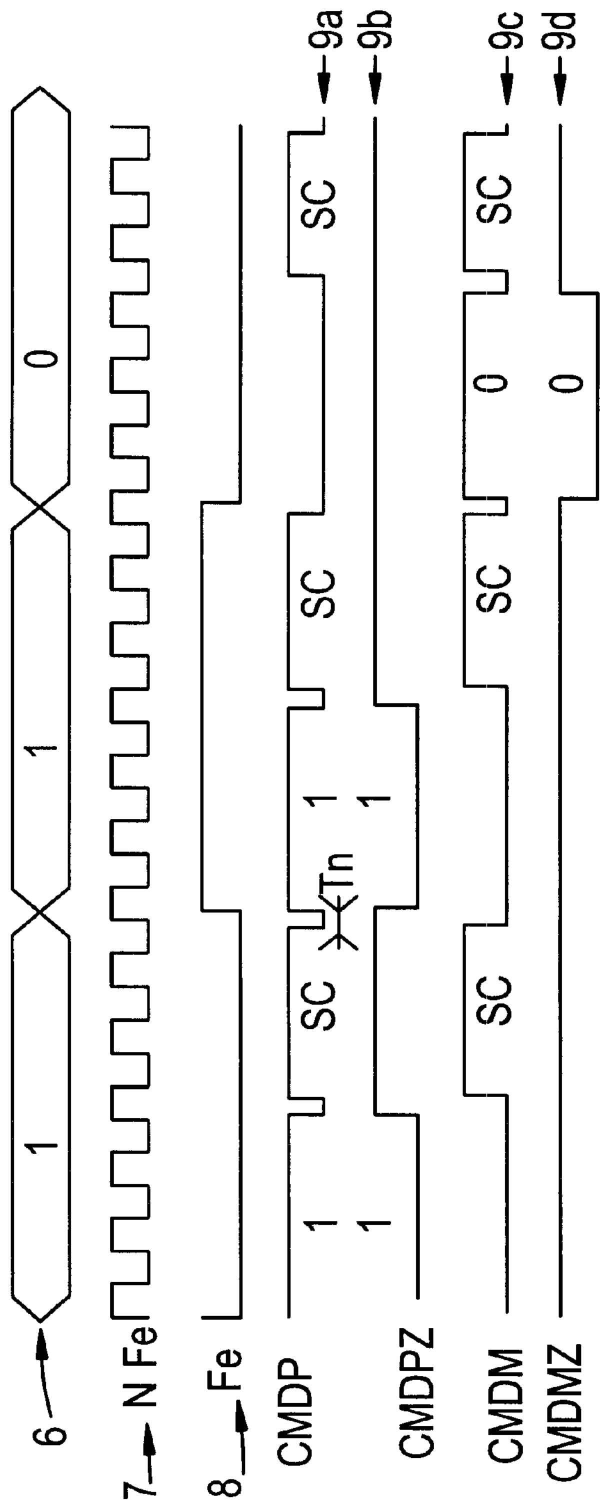
FIG. 2 shows one example of coding a signal and signals at various input terminals.

FIG. 2 explains how the volume is modulated in the transmitted signal. The wanted signal is transmitted in the first three periods Tc (corresponding to the output frequency Fc) of the bit stream. This value is denoted Tt. The numerical values chosen in this example provide six periods Tc in one period Te. Instead of being energized once in the time Te, the loudspeaker is energized Tt/Tc times in the time Tt. The volume is adjusted by defining the number Tt/Tc.

The human ear is not able to perceive the change in frequency of the loudspeaker. The 1-bit words at the frequency Fe are shown in line 6. Lines 7 and 8 respectively represent the periods Tc and Te. The lines 9*a*, 9*b*, 9*c*, 9*d* respectively show the signals at the terminals CMDP, CMDPZ, CMDM, CMDMZ of the output bridge. In this example, the wanted signal is transmitted in the first three periods Tc: Tt/Tc=3. The information concerning the volume is then the ratio Tt/Te.

The three periods after Tt are not used, especially in a first variant in which there is no passive filter at the terminals. A passive filter is added to eliminate noise.

In the case of use with no passive filter, it is advantageous, but not obligatory, to apply a short-circuit during the residual periods in order to eliminate residual charges. If a passive filter is used, a short-circuit prevents charges remaining and degrading said filter. Using a passive filter with no short-circuit makes it obligatory to employ additional devices to eliminate the residual charges, and such devices compromise the efficiency and simplicity of the device.

Any component for dividing the period of the signal into sub-periods can replace the clock. In particular, if division into regular periods is more advantageous, any other division can be used, which will complicate reading the information concerning the volume. For a given volume adjustment, any type of division of the signal is possible in the main period Te.

The most important information is the overall number of sub-periods used: Tt/Tc. It is not obligatory for all these periods to be consecutive.

In this case, the part of the predetermined period for adjusting the volume includes non-consecutive sub-periods. The total time Tt still contains the information.

It is necessary for this distribution to be reproducible.

A variant modifies the distribution of the wanted signals as a function of the volume. This variant optimizes the use of the various components.

What is claimed is:

1. An audio receiver system including:

a modulator for modulating a first digital audio signal with a first modulation rate and a second digital audio signal including a plurality of 1-bit words over a predetermined period at a second modulation rate higher than the first modulation rate, and an output device including a loudspeaker and a transmitter for transmitting the second signal in analog form to the loudspeaker, characterized in that it further includes a control device connected to the modulator and receiving the signal from it and to the output device, the control device is adapted to control the output device from a portion of said predetermined period, and the length of said portion is determined as a function of the required volume.

2. An audio receiver system according to claim 1, characterized in that the output device includes a passive filter at the loudspeaker.

3. An audio receiver system according to claim 1, characterized in that the portion of the predetermined period for adjusting the volume includes sub-parts that are not all consecutive.

4. An audio receiver system according to claim 3, characterized in that the distribution of the sub-parts which are not all consecutive is a function of the required volume.

5. A terminal characterized in that it includes an audio receiver system according to claim 1.

6. An audio reception method including:

a step of modulating a first digital audio signal with a first modulation rate and a second digital audio signal including a plurality of one-bit words over a predetermined period with a second modulation rate higher than the first modulation rate, and a step of receiving said second signal in a loudspeaker, characterized in that, before the reception step, the loudspeaker is controlled as a function of a portion of said predetermined period, the length of said portion being determined as a function of the required volume.

7. An audio reception method according to claim 6, characterized in that the length of said portion commands application of a power supply short-circuit.

8. An audio reception method according to claim 6, characterized in that the first digital audio signal is modulated in a modulator and includes a plurality of 1-bit words.

* * * * *